US010247787B2

(12) United States Patent
Cordray et al.

(10) Patent No.: US 10,247,787 B2
(45) Date of Patent: *Apr. 2, 2019

(54) POWER DETECTION SYSTEM FOR VALVE ACTUATORS

(71) Applicant: Tri-Tec Manufacturing, LLC, Kent, WA (US)

(72) Inventors: Richard Lynn Cordray, Redmond, WA (US); Michael M. Van Schoiack, Bellevue, WA (US); Roy Gilbert, Redmond, WA (US)

(73) Assignee: Tri-Tec Manfacturing, LLC, Kent, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/981,593

(22) Filed: May 16, 2018

(65) Prior Publication Data

US 2018/0259589 A1 Sep. 13, 2018

Related U.S. Application Data

(63) Continuation of application No. 15/650,720, filed on Jul. 14, 2017, now Pat. No. 9,995,795, which is a continuation of application No. 14/621,284, filed on Feb. 12, 2015, now Pat. No. 9,739,840.

(51) Int. Cl.
*G01R 31/40* (2014.01)
*F16K 37/00* (2006.01)

(52) U.S. Cl.
CPC .......... *G01R 31/40* (2013.01); *F16K 37/0083* (2013.01)

(58) Field of Classification Search
CPC .............. G01R 31/40; F16K 37/0083

USPC ........................................ 251/129.01, 129.04
See application file for complete search history.

(56) References Cited

U.S. PATENT DOCUMENTS

| 4,445,075 | A | 4/1984 | Fry |
| 4,751,653 | A | 6/1988 | Junk et al. |
| 5,029,597 | A | 7/1991 | Leon |
| 5,519,295 | A | 5/1996 | Jatnieks |

(Continued)

FOREIGN PATENT DOCUMENTS

| CN | 202693688 U | 1/2013 |
| KR | 20080036317 A | 4/2008 |

OTHER PUBLICATIONS

Noelp et al., "Advantages of Variable Speed Actuators", Valve World, Oct. 2005, pp. 47-54.

*Primary Examiner* — Christopher E Mahoney
(74) *Attorney, Agent, or Firm* — Seed IP Law Group LLP

(57) ABSTRACT

A system and method to detect the loss or disruption of one or more phases of a three phase alternating current (AC) power source used in the operation of a valve actuator. The loss of one or more phases of a three phase AC power source may cause a peak in AC power output. While a peak in AC power output may not affect an operation of electronic circuitry, all three phases are often required to safely operate other hardware components, such as an AC motor that is associated with the valve actuator. Therefore, in response to detecting the loss or disruption of at least one phase of a three phase AC power source, this disclosure presents a system and method to inhibit damaging operations such as operating an AC motor associated with a valve actuator, and continuing to operate communications and diagnostic circuitry to report the condition.

22 Claims, 4 Drawing Sheets

(56) References Cited

U.S. PATENT DOCUMENTS

| | | | |
|---|---|---|---|
| 5,986,909 | A | 11/1999 | Hammond et al. |
| 6,404,348 | B1 | 6/2002 | Wilfong |
| 9,739,840 | B2 * | 8/2017 | Cordray ................ G01R 31/40 |
| 9,995,795 | B2 * | 6/2018 | Cordray ................ G01R 31/40 |
| 2002/0080542 | A1 | 6/2002 | Mendoza et al. |
| 2005/0283277 | A1 | 12/2005 | Schulz |
| 2010/0080022 | A1 | 4/2010 | Schmidt |
| 2014/0254217 | A1 | 9/2014 | Li et al. |
| 2016/0056706 | A1 | 2/2016 | Inomata |
| 2016/0094180 | A1 | 3/2016 | Ajima et al. |

\* cited by examiner

POWER DETECTION SYSTEM FOR VALVE ACTUATORS

BACKGROUND

Certain types of watercraft (e.g. ships, aircraft carriers, etc.) are configured with multiple valves situated throughout the vessel. Valve actuators are configured to operate the valves by opening or closing the valves, thereby regulating the flow of fluid through a passageway. Electronic valve actuators can be programmed with positional setting and torque settings to electronically operate the valves between the open and close positions.

Electronic valve actuators have been used in Navy equipment for more than 15 years. First generation electronic valve actuators were often constructed by purchasing rugged commercial power supplies, and then supplying them with one phase of a three phase power supply. Many of these power supplies traditionally used electrolytic capacitors that have a tendency to dry out over years of service. Many of these power supplies also proved to be physically substantial, imposing significant mounting challenges due to their size and weight. Moreover, shock and vibration design requirements often added further size and weight penalties.

In power systems where the valve actuator electric motor is operated by a three phase alternating current (AC) power supply, loss of one of the three phases can result in substantial damage to an electric motor, wiring, and associated electrical mechanical components including damage to the attached valve.

Therefore, it is desirable to detect the loss or disruption of one or more phases of an AC power source before loss of a phase or degradation of the quality of the three phase AC power can cause damage to hardware components.

SUMMARY

Described herein are techniques and systems for detecting the loss or disruption of one or more phases of a three phase alternating current (AC) power source. The loss or disruption of one or more phases of a three phase AC power source may cause abnormally high or abnormally low voltage to be transmitted to downstream hardware components. The abnormal voltage may damage or affect the long-term operating life of the hardware components. Also disclosed herein is a valve actuator configured to operate using the three phase AC power source. The valve actuator may include an AC motor used to operate a valve. The valve actuator may also include components to rectify and filter the AC power source and produce a substantially constant direct current (DC) output voltage. The DC output voltage may be used to operate internal components of the valve actuator, such as microcontrollers.

In some embodiments, the process for detecting the loss or disruption of one or more phases of the three phase AC power source may include detecting a change in voltage of each phase of the three phase AC power source using voltage sensors. For instance, three voltage sensors can each interface with different phases of the three phase AC power source. The voltage sensors can be configured to detect whether a loss or disruption of one or more phases of the three phase AC power source has occurred. If a voltage sensor detects the loss or disruption of a phase of the AC power source, the voltage sensor may generate and transmit a signal indicating such, to a microcontroller for downstream use.

In some embodiments, the microcontroller may be communicatively coupled to an AC motor controller. The AC motor controller may be configured to control the operation of the AC motor by causing the AC motor to provide varying levels of output power for operating the valve. For example, the microcontroller may transmit a signal to the AC motor controller indicating that the loss or disruption of one or more phases of the three phase AC power source has occurred. In response, the AC motor controller may modify the operation of the AC motor based at least in part on the indication received from the microcontroller.

In some embodiments, in response to receiving an indication of a phase loss or disruption, the AC motor controller may stop operation of the valve actuator by stopping the supply of AC power to the AC motor. In other embodiments, the AC motor controller may allow normal operation of the valve actuator to occur for a predetermined time interval. In yet another embodiment, the AC motor controller can issue an alarm or transmit an alert message to an operator, indicating the loss or disruption of one or more phases of the three phase AC power source.

Some examples of downstream uses of identifying a loss or disruption of one or more phases of a three phase AC power source may include helping prevent damage to components of the valve system, and allowing the valve system to operate properly within specifications.

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Described herein are techniques and systems for determining the disruption or loss of one or more phases of a three phase AC power source. The techniques and systems may be equally applied during an idle or operational phase of the valve actuator. An operational phase of the valve actuator may include powering the AC motor to operate the valve. An idle phase may include, but is not limited to, running system diagnostics of the valve actuator that do not require powering the AC motor or actuating the valve. Some embodiments disclosed herein are described, by way of example and not limitation, with reference to a valve system that is suitable for use in marine environments, such as ocean liners, or ships including military ships and submarines. However, it is to be appreciated that other types of valve systems of varying designs may benefit from the techniques and systems disclosed herein.

As used herein, the term "valve" is broadly construed to include, but is not limited to, a device capable of regulating a flow of one or more substances through one or more passageways by opening, closing, or partially blocking the one or more passageways. For example, a valve can halt or control the flow of a fluid (e.g. a liquid, a gas, a fluidized solid, or mixtures thereof) through a conduit, such as a pipe, a tube, a line, a duct, or another structural component (e.g., a fitting) for conveying substances. Valve types include, without limitation, ball valves, butterfly valves (e.g. concentric, double offset, triple offset, etc.), globe valves, plug valves, and the like.

Example Valve System

Figure 1:
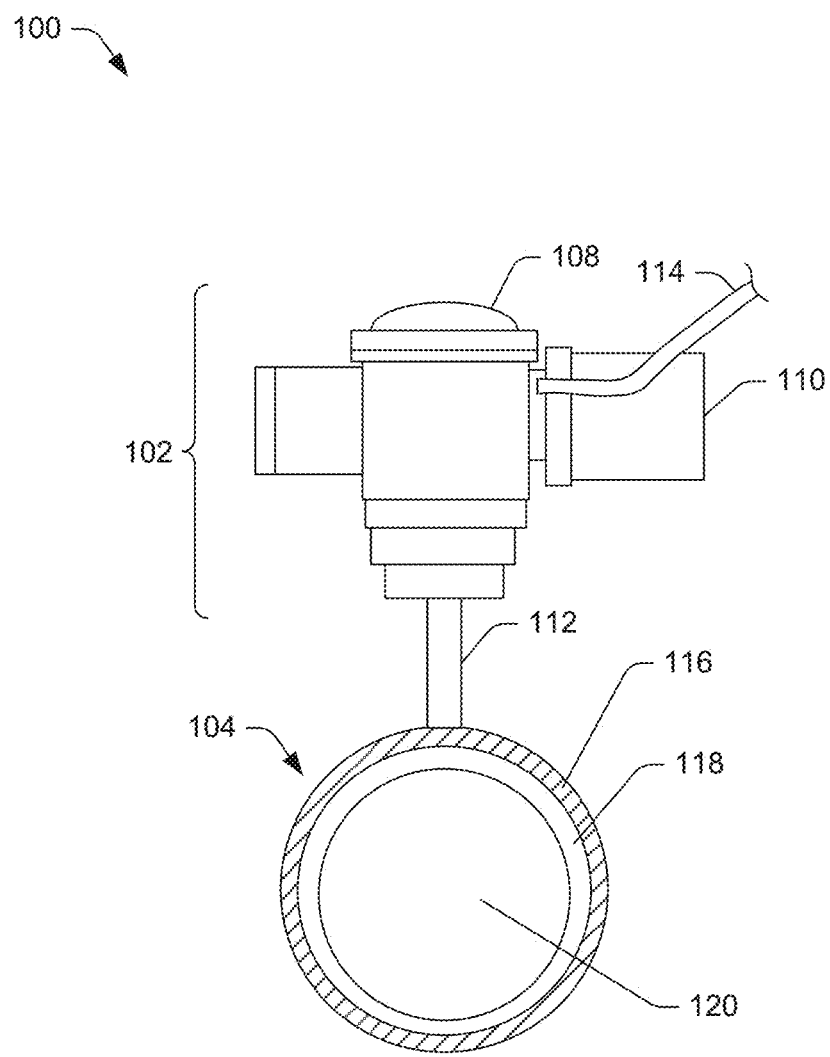
FIG. 1 illustrates a side elevation view of an example valve system in a closed position.

FIG. 1 illustrates a side elevation view of an example valve system 100. The valve system may be associated with a larger system, such as a plant (e.g. a water treatment plant, a power plant, etc), a refinery, a factory, or a vehicle such as a watercraft. Furthermore, the valve system 100 may represent one of a plurality of valve systems associated with the larger system. As noted above, the valve system 100 may be implemented in any suitable environment, which may include, without limitation, a non-corrosive environment, a corrosive environment, a magnetic environment, a non-magnetic environment, a moist environment, a marine environment, or a combination thereof. In some embodiments, the valve system 100 may be used in civilian or military watercraft (e.g. ocean liners, floating vessels, boats, ships, submersible vehicles such as submarines, and the like). Marine environments can be especially harsh on the operation of the electrical/mechanical components because of an abundance of corrosive substances, such as salt water.

The valve system 100 includes a valve actuator 102 coupled to a valve 104. FIG. 1 illustrates the valve 104 in a closed position. The valve 104 may be positioned in a passageway 106 and may operate between the opened (not shown) and closed positions to regulate the flow of fluids and like substances through the passageway 106. The valve actuator 102 may utilize various components (not shown) to automatically control the operation/actuation of the valve 104 in order to open and close the valve 104.

The valve actuator 102 may include a main body 108 coupled to an actuator motor 110. The main body 108 may house internal components (e.g., mechanical and electrical components, such as a gear train, microcontrollers, sensors and so on)(not shown). A housing (not shown) of the main body 108 may protect the internal components from the environment. The actuator motor 110 is configured to convert electrical energy to mechanical force or motion. When energized, the actuator motor 110 causes the actuation of the valve 104 by transmitting the output of the actuator motor 110 to a drive assembly (not shown) inside the main body 108.

The drive assembly may include, without limitation, a gear train, worm gear assembly, spur gears, planetary gears, drive belts, drive shafts, drive chains, clutch plates, and so on, that are configured to work together to transmit the output of the actuator motor 110 to a connector 112, and ultimately to the valve 104. That is, the drive assembly in the main body 108 is configured to transmit the force produce by the actuator motor 110 to the connector 112 that couples the valve actuator 102 to the valve 104. The connector 112 may rotate about an axis to transmit the force to the valve 104. A power line 114 delivers power from a power source (not shown) to the actuator motor 110 and other electrical components that are provided in the main body 108. In some embodiments, the actuator motor 110 may be a constant speed actuator motor 110. In other embodiments, the actuator motor 110 may be a variable speed actuator motor.

The valve 104 may comprise a valve housing 116, a valve seat 118 that is carried by the valve housing 116, and a valve member 120. The valve member 120 is movable between a closed and opened (not shown) position. The valve member 120 is shown as a generally circular disk in FIG. 1.

Figure 2:
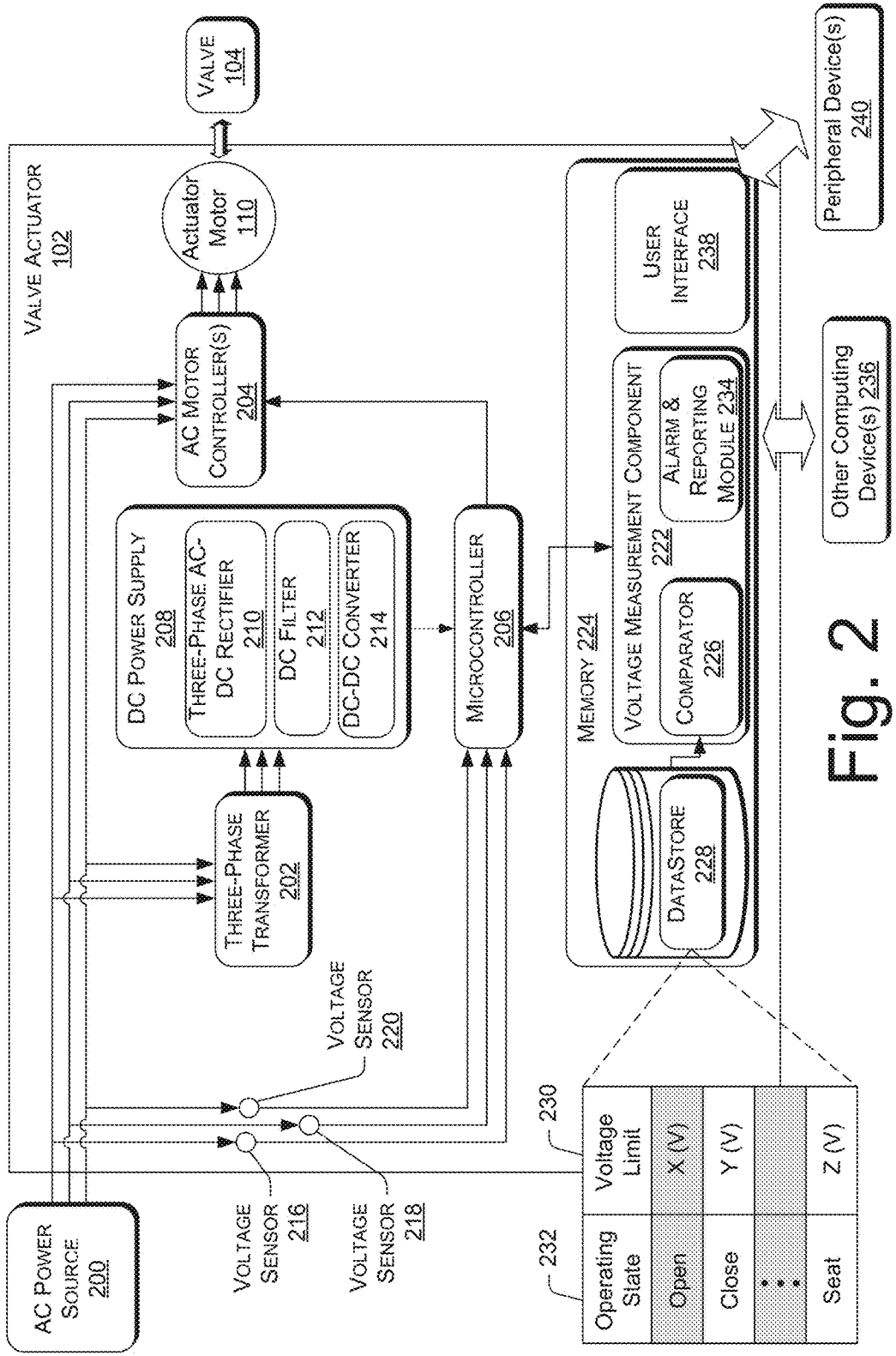
FIG. 2 illustrates an example architecture that implements the detection of a loss or disruption to at least one phase of a three phase AC power source.

FIG. 2 illustrates an example architecture that implements the detection of a loss or disruption to at least one phase of a three phase AC power source 200. In the preferred embodiment, the actuator motor 110 is powered by the three phase AC power source 200. In other embodiments, the actuator motor 110 may be powered by a substantially constant direct current (DC) power supply. The DC power supply may be generated through a rectification and filtering process of a three phase AC power source 200.

In the preferred embodiment, the actuator motor 110 is powered by the three phase AC power source 200. The actuator motor 110 may comprise a three phase load, such as a three phase AC induction motor. In this manner, electrical power from the AC power source 200 may be coupled to the actuator motor 110 for energizing the actuator motor 110 for use in actuating the valve 104. The actuator motor 100 may energize the drive assembly (not shown) in the main body 108 and power the actuation of the valve 104. In some embodiments, the actuator motor 110 may be a constant speed AC motor. In other embodiments, the actuator motor 110 may be of the kind whose speed is adjustable by varying the input voltage or alternating current frequency to the motor.

In some embodiments, the AC input power from the three phase AC power source 200 can be transmitted to one or more AC motor controller(s) 204 to operate the actuator motor 110. In other embodiments, AC input power from the three phase AC power source 200 is first passed through a three phase transformer 202 (not shown). The three phase transformer 202 is configured to reduce or increase the AC voltage (e.g. amplitude of the AC) to a predetermined voltage level to operate the AC motor 110. Examples of three phase transformers may include, but are not limited to, three individual transformers, and a single poly-phase transformer of core-type or shell-type construction connected in a delta or Y-configuration.

The AC motor controller(s) 204 (hereinafter referred to individually as "the AC motor controller 204" and collectively as "the AC motor controller(s) 204") may be communicatively coupled to the actuator motor 110 and programmed to control the actuator motor 110 by causing the actuator motor 110 to provide varying levels of output power for operating the valve 104, and to power the drive assembly (not shown) in both forward and reverse directions. In some embodiments, the AC motor controller(s) 204 may be configured through a calibration process, to operate the actuator motor 110 at varying speeds or output according to different operating states of the valve 104.

In some embodiments, the three phase AC power source 200 may be converted to a substantially constant direct current (DC) power supply 208 through a rectification and filtering process. The resulting DC output of the DC power supply 208 may be used to power internal components of the valve actuator 102, such as a microcontroller 206.

In at least one embodiment, the AC power from the three phase transformer 202 may be transmitted to a three phase AC-DC rectifier 210 to implement the rectification process. The AC-DC rectifier 210 may be used to produce a DC output from the three phase AC power source 200. Because of the alternating nature of an input AC sine wave, the DC output from the AC-DC rectifier 210 consists of six pulses of current for each cycle of the three phase AC input power. Examples of an AC-DC rectifier 210 may include, but are not limited to, semi-conductor rectifiers such as diodes, and controlled switching solid-state switches such as thryistors configured as a three phase half wave or full wave bridge.

Following the rectification process, a filtering process may be implemented by a DC filter 212 to smooth the six pulses of current associated with the rectified DC output. The DC filter 212 may use capacitors that release stored energy during the part of an AC cycle that does not supply any power. An added advantage of rectifying a three phase AC power source is that the resulting DC output produces less ripple than a rectified DC output from a single-phase AC power source. As a result, less total capacitance can be required to filter the DC output. This in turn means that relatively light weight ceramic capacitors may be used as the DC filter 212 rather than relatively larger and heavier electrolytic capacitors. Other examples of a DC filter 212 may include, but are not limited to, capacitors, generally, including electrolytic and ceramic capacitors, and a capacitor-input filter circuit incorporating additional components such as inductors.

Following the filtering process, a DC-DC converter 214 may be used to convert the filtered DC output from the DC filter 212 from one voltage level to another predetermined voltage level. The DC-DC converter 214, also known as a power converter, offers a means to ensure that the rectification and filtering process of three phase AC power to DC power can be used to facilitate a wide range of devices having various DC power requirements. In this instance, the DC-DC converter 214 may be used to ensure the filtered DC output that is transmitted to the microcontroller 206 is transmitted at a predetermined voltage level that is consistent with the microcontroller's 206 specifications. In at least one embodiment where the actuator motor 110 is a DC motor, the DC-DC converter 214 may ensure that the filtered DC output that is transmitted to the actuator motor 110 is consistent with the actuator motor's 110 specifications. Examples of a DC-DC converter 214 may include, but are not limited to, linear converters, switched-mode converters, switch-capacitors, magnetic type converters, and active voltage regulators of the linear or switch type.

In some embodiment, the output from the three phase transformer 202 may be used to power the actuator motor 110. The actuator motor 110 may be configured to operate over a narrow variation of AC input. That is, the actuator motor 110 may operate unimpeded despite the loss or disruption of one or more phases of the three phase AC power source 200. As noted earlier, the loss or disruption of one or more phases of the three phase AC power source 200 may cause an abnormally high or low AC voltage to be transmitted to a hardware component, such as the actuator motor 110, In some embodiments, the actuator motor 110 may be configured to operate safely at the abnormal AC input, and therefore, may continue to operate normally, despite the loss of one phase of the three phase AC power source 200.

In other embodiments, the loss of one phase of a three phase AC power source 200 can mean that the continued operation of the actuator motor 110 may cause damage to critical components or harm the long-term service life of the actuator motor 110 or the valve actuator 102, generally. In these instances, and as discussed in more detail below, the operation of the valve actuator 102 may be stopped or restricted.

In some embodiments, to detect the loss of one or more phases of the three phase AC power source 200, the valve actuator 102 may comprise three voltage sensors 216, 218, 220 to interface with the three phases of the AC power source 200. Each voltage sensor 216, 218, 220 interfaces with a different phase of the three phase AC power source 200, and each voltage sensor 216, 218, 220 is intended to detect a loss or disruption of the interfacing phase of the three phase AC power source 200. In response to detecting a loss or disruption of one or more phase of the three phase AC power source 200, each voltage sensor 216, 218, 220 may generate a signal that is transmitted to a microcontroller 206, the signal being indicative of the phase loss or disruption. A disruption of the interfacing phase might be an increase or decrease in voltage, including the loss of the phase, a non-sinusoidal waveform, excessive electrical noise, voltage spikes, or any other alteration of the normal phase alternating current.

In some embodiments, each voltage sensor 216, 218, 220 may be stepped down using resistors to a processor voltage level that may be run through an analog and digital converter. In other embodiments, the voltage sensors 216, 218, 220 may comprise analog-to-digital (A/D) converters (not shown) to convert analog power input signals to digital power input signals for downstream digital signal processing.

The analog signal from each voltage sensor 216, 218, 220 may be transmitted to the microcontroller 206. The microcontroller 206 may compare each analog signal from each voltage sensor 216, 218, 220 with a predetermined value of signal amplitude to determine whether or not a phase loss or disruption has occurred. In some embodiments, the microcontroller 206 can be communicatively coupled to an AC motor controller(s) 204 that is programmed to control the actuator motor 110. In response to receiving a signal of a phase loss or disruption from the microcontroller 206, the AC motor controller(s) 204 may inhibit or restrict the operation of the actuator motor 110.

In some embodiments, the AC motor controller(s) 204 may be communicatively coupled to the actuator motor 110 and programmed to control the actuator motor 110 by causing the actuator motor 110 to provide varying levels of output power for operating the valve 104, and to power the drive assembly (not shown) in both the forward and reverse directions. In some embodiments, the AC motor controller(s) 204 may be configured, through a calibration process, to operate the actuator motor 110 at varying speeds or output according to different operating states of the valve 104. For example, during the operating state of "opening" the valve 104 from a closed position, the AC motor controller(s) 204 may control the actuator motor 110 to operate at a predetermined speed or output. Other operating states of the valve 104 (e.g. closing, seating, rotating between open and closed positions, etc.) may require different respective speeds or output.

In some embodiments, the microcontroller 206 transmits the signal received from the voltage sensors 216, 218, 220 to a voltage measurement component 222 stored in computer-readable memory 224 of the valve actuator 102. Computer-readable media may include two types of computer-readable media, namely computer storage media and communications media. The memory 224 is an example of computer storage media. Computer storage media may include volatile and non-volatile, removable, and non-removable media implemented in any method or technology for storage of information, such as computer readable instructions, data structures, program modules, or other data. Computer storage media includes, but is not limited to, RAM, ROM, electrically erasable programmable read-only memory (EEPROM), flash memory of other memory technology, compact disc read-only memory (CD-ROM), DVD, or other optical storage, magnetic cassettes, magnetic tape, magnetic disk storage or other magnetic storage devices, or any other non-transmission medium that may be used to store the desired information and which may be accessed by the valve actuator 102.

Any such computer storage media may be part of the valve actuator 102. In general, computer storage media may include computer-executable instructions that, when executed by the microcontroller 206, perform various functions and/or operations described herein.

In contrast, communications media embody computer-readable instructions, data structures, program modules, or other data in a modulated data signal, such as a carrier wave, or other transmission mechanism. As defined herein, computer storage media does not include communications media.

In some embodiments, the voltage measurement component 222 includes a comparator 226 that is configured to compare one or more voltage measurements received from the microcontroller 206, via the voltage sensors 216, 218, 220, to a datastore 228 that stores the voltage limits 230. The voltage limits 230 can include predetermined voltage limits for a particular valve actuator 102, actuator motor 110, or an operating state 232 of the valve actuator 102. For example, the datastore 228 that stores the voltage limits 230 may associate different operating states 230 of the valve 104 with voltage limits 230. The voltage limits 230 may represent the peak voltages at which the actuator motor 110 may operate without causing harm to critical components or compromising the long-term service life the valve actuator 102. Therefore, in response to detecting a phase loss or disruption, the comparator 226 can determine whether the measured peak voltage from each voltage sensor 216, 218, 220 exceeds the voltage limits 230 associated with a desired operation of the valve actuator 102. In instances where the operating state 232, such as "opening" the valve 104, has a voltage limit 230 that is higher than the measured peak voltage from the voltage sensors 216, 218, 220, the comparator 226 may communicate with the microcontroller 206 that the actuator motor 110 may safely operate, despite experiencing a phase loss or disruption. However, if the operating state 232, such as "seating" the valve 104, has a voltage limit 230 that is lower than the measured peak voltage from each voltage sensor 216, 218, 220, the comparator 226 may communicate with the microcontroller 206 to stop the operation of the actuator motor 110. Note that FIG. 2 illustrates a feedback loop from the voltage measurement component 222 to the microcontroller 206 for the purpose of communicating an indication to the microcontroller 206 to stop the operation of the actuator motor 110. The microcontroller 206 may receive an indication from the voltage measurement component 222 that the current voltage meets or exceeds the voltage limit 230 specified in the memory 224. In response, the microcontroller 206 may communicate an indication to the AC motor controller(s) 204 to halt any further actuation of the valve 104 in order to mitigate any possible damage to the actuator motor 110 or valve actuator 102, generally.

In some embodiments, the AC motor controller(s) 204 may restrict the operation of the actuator 110, rather than fully halt all operations. For example, the AC motor controller(s) 204 may allow the actuator motor 110 to operate for a predetermined time interval, before halting operations. The predetermined time interval may provide sufficient time to allow the valve to move into a "seated position" before operations are halted. In another embodiment, the AC motor controller(s) 204 may restrict the operating speed of the actuator motor 110 to a predetermined operating speed, if the actuator motor 110 is of a kind that can operate at varying speeds. In some embodiments, the predetermined operating speed of the actuator motor 110 may be determined by an amount of torque generated by the actuator motor 110.

In some embodiments, the voltage measurement component 222 uses voltage measurement techniques that may also indicate whether the three phases of the three phase AC power source 200 are wired out of sequence. For example, if the three phases are incorrectly wired as ACB, instead of ABC, the actuator motor 110 may want to turn in the opposite direction. Therefore, by identifying a wiring error, the voltage measurement component 222 may prevent damage to critical components of the valve actuator 102 or the valve 104, generally.

In some embodiments, the memory 224 may include an alarm and reporting module 234 that is configured to send various communications including alerts, alarms, notifications, and/or reports. These communications may be sent to one or more other computing device(s) 236, such as over a network (e.g. the Internet, an intranet, a wired or wireless network, a cellular network, or a combination thereof), or another type of connection (e.g. peer-to-peer (P2P), direct wireless or wired device-to-device connection, etc.), and so on.

In some embodiments, the various communications that may be sent by the alarm and reporting module 234 may be triggered by the voltage measurement component 222 receiving an indication that a loss or disruption of one or more phases of the three phase AC power source 200, has occurred. In other embodiments, the various communications may be triggered by the comparator 226 of the voltage measurement component 222 receiving an indication that the measured voltage from one or more voltage sensors 216, 218, 220 exceeds a voltage limit 230.

In some embodiments, the various communications that may be sent by the alarm and reporting module 234 to the other computing device(s) 236 may include, without limitation, an audible sound, a light (e.g. a flashing light emitting diode (LED)), a short message service (SMS) text message, an electronic mail (e-mail), a banner notification, toast notification, or any similar notification at the other computing device(s) 236. In this manner, a user of the other computing device(s) 236, such as a maintenance operator of the valve system 100, may receive the notification and may take appropriate remedial action in response, such as dispatching personnel to the valve system 100 to diagnose the problem, sending a ticket to a valve maintenance entity, or sounding an alarm in the larger system where the valve system 100 is implemented. For example, if proper operation of the valve 104 is needed to ensure safety to personnel aboard a vessel, an alarm on the vessel may be sounded in response to the notification sent by the alarm and reporting module 234.

In some embodiments, the memory 220 may include a user interface 238. The user interface 238 may be a touchsensitive display, microphone, keyboard or joystick-like controller. In other embodiments, the user interface 238 may comprise a communicative port, such as an Ethernet port or a Universal Serial Bus (USB) that establishes a communicative connection between the memory 220 and a peripheral electronic device 240. A peripheral electronic device 240 may any electronic device, such as a cellular phone, a tablet computer, an electronic reader, a media player, a gaming device, a personal computer (PC), a laptop computer, etc.

The user interface 238 may present selectable options to configure the alarm and reporting module 234. For example, an operator of the valve actuator 102 may select one or more users or other operators to receive a report of the loss of phase of the three phase AC power source 200. The user interface may also present selectable options associated with the types of alarms and reports that may be communicated to selected users of the other computing device(s) 236.

Moreover, in at least one embodiment, various communications may be sent by the alarm and reporting module 234, in response to determining that the three phases of the three phase AC power source 200 are wired out of sequence.

Example Processes

The processes described in this disclosure may be implemented by the architecture described herein, or by other architectures. These processes are illustrated as a collection of blocks in a logical flow diagram. Some of the blocks represent operations that can be implemented in hardware, software, or a combination thereof. In the context of software, the block represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order or in parallel to implement the processes. It is understood that the following processes may be implemented on other architectures as well.

Figure 3:
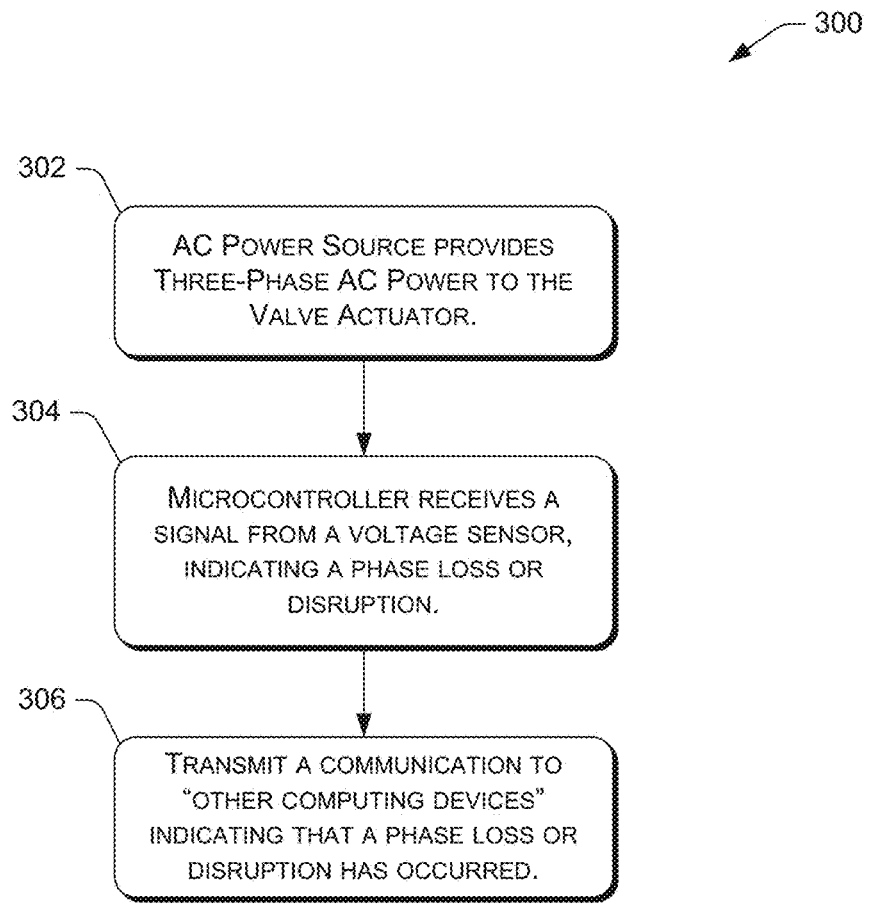
FIG. 3 illustrates a flow chart of an example process for transmitting a communication to other computing devices, in response to receiving an indication of a phase loss or disruption of at least one phase of the three phases AC power source.

FIG. 3 illustrates a flowchart of an example process 300 for transmitting a communication to other computing device(s) 236 in response to receiving an indication of a phase loss or disruption of one or more phases of the three phase AC power source 200. The process 300 may be implemented by one or more components of the valve actuator 102, and in particular the actuator motor 110, the microcontroller 206, the AC motor controller(s) 204, and the voltage measurement component 222.

At 302, the three phase AC power source 200 provides three phase AC power to the valve actuator 102. Three voltage sensors 216, 218, 220 interface with different phases of the three phase AC power source 200.

At 304, the microcontroller 216 receives a signal from at least one voltage sensor 325, 216, 218 indicating a loss or disruption of at least one phase of the three phase AC power source 200. The microcontroller 216 then transmits the indication of the phase loss or disruption to the voltage measurement component 218.

At 306, in response to receiving an indication of a loss or disruption of at least one phase of the three phase AC power supply, the alarm and reporting module 234 of the voltage measurement component 222 may transmit a communication to the other computing device(s) 236 indicating that a phase loss or disruption has occurred. The communication may include, without limitation, an audible sound, a light (e.g. a flashing light emitting diode (LED)), a short message service (SMS) text message, an electronic mail (e-mail), a banner notification, toast notification, or any similar notification at the other computing device(s) 236. In one embodiment, if proper operation of the valve 104 is needed to ensure the safety of personnel aboard a vessel, an alarm on the vessel may be sounded in response to the notification sent by the alarm and reporting module 234.

Figure 4:
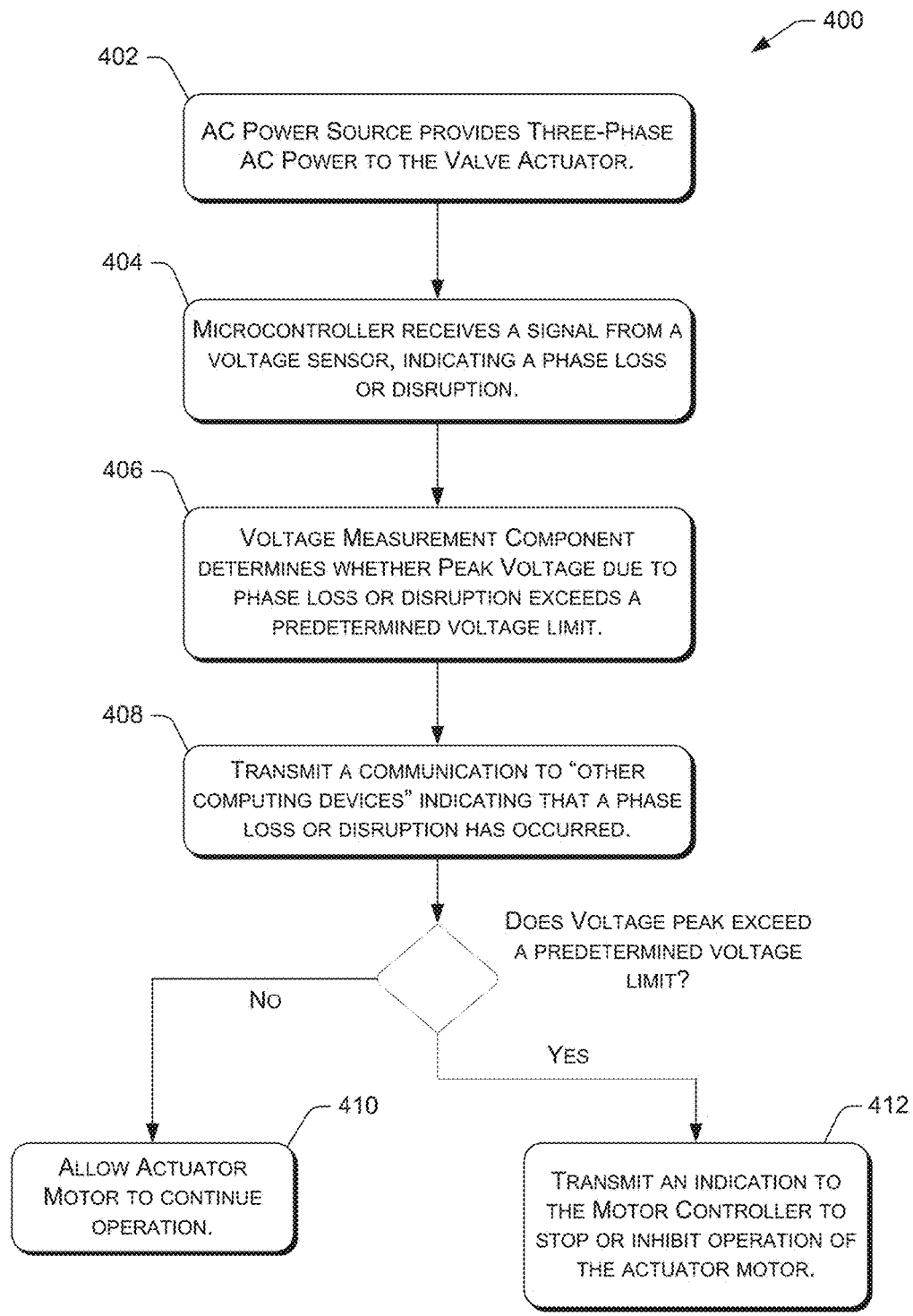
FIG. 4 illustrates a flow chart of an example process for causing the microcontroller to modify the operation of the actuator motor, in response to receiving an indication of a phase loss or disruption of at least one phase of the three phase AC power source.

FIG. 4 illustrates a flowchart of an example process 400 for causing the AC motor controller(s) 204 to modify the operation of the actuator motor 110, in response to receiving an indication of a phase loss or disruption of at least one phase of the three phase AC power source 200. The process 400 may be implemented by one or more components of the valve actuator 102, and in particular the actuator motor 110, the microcontroller 206, AC motor controller(s) 204, and the voltage measurement component 222.

At 402, the three phase AC power source 200 provides three phase AC power to the valve actuator 102. Three voltage sensors 216, 218, 220, interface with different phases of the three phases of the AC power source 200. At 404, the microcontroller 206 receives a signal from at least one voltage sensor 216, 218, 220, indicating a loss or disruption of at least one phase of the three phase AC power source 200. The microcontroller 206 then transmits the indication of the phase loss or disruption to the voltage measurement component 222.

At 406, the alarm and reporting module 234 of the voltage measurement component 222 may transmit a communication to other computing device(s) 236, indicating that a phase loss or disruption has occurred. The communication may include, without limitation, an audible sound, a light (e.g. a flashing light emitting diode (LED)), a short message service (SMS) text message, an electronic mail (e-mail), a banner notification, toast notification, or any similar notification at the other computing device(s) 236. In one embodiment, if proper operation of the valve 104 is needed to ensure the safety of personnel aboard a vessel, an alarm on the vessel may be sounded in response to the notification sent by the alarm and reporting module 234.

At 408, the voltage measurement component 222 may determine a peak voltage associated with the remaining two-phases of the three phase AC power source 200. This process may involve a comparator 226 determining whether the peak voltage associated with the remaining two-phases of AC power exceeds a predetermined voltage limit 230. The datastore 228 of operating states 230 and voltage limits 230 may be associated with the valve actuator 102, or the actuator motor 110. The operating states 230 may include, but at not limited to, opening, closing, seating, and rotating the valve 104 between an open and closed position.

At 410, if the peak voltage of the two remaining phases of three phase AC power source 200 does not exceed a predetermined voltage limit, the voltage measurement component 222 may transmit an indication to the microcontroller 206 that the actuator motor 110 may continue normal operation. The microcontroller 206 may transmit the same indication, or another indication to the AC motor controller(s) 204, indicating that the actuator motor 110 may continue normal operation.

At 412, if however, the peak voltage of the two remaining phases of the three phase AC power source 200 does exceed a predetermined voltage limit, the voltage measurement component 222 may transmit an indication to the microcontroller 206 to stop or inhibit the operation of the actuator motor 110. The microcontroller 206 may transmit the same indication, or another indication to the AC motor controller(s) 204, indicating that the peak voltage has exceeded a predetermined voltage limit. In response, the AC motor controller(s) 204 may stop or inhibit the operation of the actuator motor 110. In some embodiments, the AC motor controller(s) 204 may restrict the operation of the actuator 110, rather than fully halt all operations. For example, AC motor controller(s) 204 may allow the actuator motor 110 to operate for a predetermined time interval, before halting operations. For instance, the predetermined time interval may be determined as a sufficient time interval to move the valve 104 into a seating position. In another embodiment, the AC motor controller(s) 204 may restrict the operating speed of the actuator motor 110, if the actuator motor 110 is of a kind that can operate at varying speeds. In yet another embodiment, the AC motor controller(s) 204 may inhibit particular operating states of the actuator motor 110. The operating states may include, but at not limited to, opening, closing, seating, and rotating the valve 104 between an open and closed position.

CONCLUSION

Although the application describes embodiments having specific structural features and/or methodological acts, it is to be understood that the claims are not necessarily limited to the specific features or acts described herein. Rather, the specific features and acts are merely illustrative of some embodiments that fall within the scope of the claims of the application.

What is claimed:

1. A method comprising:
   detecting a disruption of a first phase of a three phase alternating current (AC) power supply; and
   comparing, in response to the detecting the disruption of the first phase, a peak voltage of a second phase of the three phase AC power supply to a voltage limit associated with an operation of an actuator motor of a valve actuator.

2. The method of claim 1, further including reporting the disruption of the first phase to a device associated with the valve actuator.

3. The method of claim 1, further including issuing an alarm in response to the detecting the disruption of the first phase.

4. The method of claim 1, further including:
   determining that the peak voltage of the second phase is below the voltage limit associated with the operation of the actuator motor; and
   continuing the operation of the actuator motor.

5. The method of claim 1, further including:
   determining that the peak voltage of the second phase exceeds the voltage limit associated with the operation of the actuator motor; and
   stopping the operation of the actuator motor.

6. The method of claim 1, further including:
   measuring a voltage of the first phase of the three phase AC power supply of the valve actuator and the peak voltage of the second phase of the three phase AC power supply.

7. The method of claim 6, wherein the measuring is performed by one or more voltage sensors.

8. A valve actuator, comprising:
   an alternating current (AC) actuator motor;
   a three phase AC power supply electrically coupled to the AC actuator motor, the three phase AC power supply including a first phase, a second phase, and a third phase; and
   a processor that, in operation:
      compares a peak voltage of the second phase of the three phase AC power supply to a voltage limit associated with an operation of the AC actuator motor in response to a disruption of a voltage signal from the first phase of the three phase AC power supply.

9. The valve actuator of claim 8, wherein the processor, in operation, transmits a report of the disruption of the voltage signal from the first phase to a device in response to the disruption of the voltage signal from the first phase.

10. The valve actuator of claim 8, wherein the processor, in operation, issues an alarm in response to the disruption of the voltage signal from the first phase.

11. The valve actuator of claim 8, wherein the processor, in operation:
    determines that the peak voltage of the second phase is below the voltage limit associated with the operation of the AC actuator motor; and
    allows the operation of the AC actuator motor.

12. The valve actuator of claim 8, wherein the processor, in operation:
    determines that the peak voltage of the second phase is below the voltage limit associated with the operation of the AC actuator motor; and
    stops or restricts the operation of the AC actuator motor.

13. The valve actuator of claim 8, wherein the processor, in operation:
    determines that the peak voltage of the second phase exceeds the voltage limit associated with the operation of the AC actuator motor; and
    stops or restricts the operation of the AC actuator motor.

14. The valve actuator of claim 8, wherein the processor, in operation:
    determines that the peak voltage of the second phase exceeds the voltage limit associated with the operation of the AC actuator motor; and
    allows the operation of the AC actuator motor.

15. The valve actuator of claim 8, further comprising one or more voltage sensors electrically coupled with the first phase and the second phase, the one or more voltage sensors configured to detect the disruption of the voltage signal from the first phase and the peak voltage of the second phase.

16. The valve actuator of claim 15, wherein the one or more voltage sensors are further configured to measure a voltage of the first phase, the second phase, and the third phase.

17. The valve actuator of claim 16, further including a microcontroller that interfaces with the one or more voltage sensors.

18. The valve actuator of claim 17, further including a direct current (DC) power supply that is rectified and filtered from the three phase AC power supply, wherein the microcontroller interfaces with the DC power supply.

19. A system comprising: a valve and a valve actuator, the valve actuator comprising:
    a three phase alternating current (AC) power supply, the three phase AC power supply including a first phase, a second phase, and a third phase;
    an AC actuator motor electrically coupled to the three phase AC power supply, the AC actuator motor being configured to operate the valve with the first phase, the second phase, and the third phase of the three phase AC power supply arranged in a first sequence;
    one or more processors; and
    memory storing a plurality of programming instructions that, when executed on the one or more processors, perform operations including: determine that the first phase, the second phase, and the third phase of the three phase AC power supply are wired in a second sequence that is different than the first sequence.

20. The system of claim 19, wherein the plurality of programming instructions, when executed on the one or more processors, perform operations further include:
   transmit a report of the first phase, the second phase, and the third phase of the three phase AC power supply being wired in the second sequence.

21. The system of claim 19, wherein the plurality of programming instructions, when executed on the one or more processors, perform operations further include:
   modify operation of the valve actuator in response to the determining that the first phase, the second phase, and the third phase of the three phase AC power supply are wired in the second sequence.

22. The system of claim 19, further including:
   a first voltage sensor electrically coupled with the first phase of the three phase AC power supply;
   a second voltage sensor electrically coupled with the second phase of the three phase AC power supply; and
   a third voltage sensor electrically coupled with the third phase of the three phase AC power supply.

* * * * *